United States Patent [19]

Nakos et al.

[11] Patent Number: 4,699,802

[45] Date of Patent: * Oct. 13, 1987

[54] DUAL CURING COATING METHOD FOR SUBSTRATES WITH SHADOW AREAS

[75] Inventors: Steven T. Nakos, Andover, Conn.; Samuel Q. S. Lin, Fort Lee, N.J.

[73] Assignee: Loctite Corporation, Newington, Conn.

[*] Notice: The portion of the term of this patent subsequent to Jul. 9, 2002 has been disclaimed.

[21] Appl. No.: 728,426

[22] Filed: Apr. 29, 1985

Related U.S. Application Data

[63] Continuation-in-part of Ser. No. 538,624, Oct. 3, 1983, Pat. No. 4,528,081.

[51] Int. Cl.$^4$ ................................................ B05D 3/06
[52] U.S. Cl. ...................................... 427/54.1; 522/44; 522/46; 522/39; 522/40; 522/77; 522/99; 528/34; 526/279
[58] Field of Search .................. 526/279; 522/99, 39, 522/40, 44, 46, 77; 427/54.1; 528/34

[56] References Cited

U.S. PATENT DOCUMENTS

| 4,201,808 | 5/1980 | Cully et al. | 522/99 |
| 4,271,425 | 6/1981 | Wong et al. | 525/474 |
| 4,348,454 | 9/1982 | Eckberg | 522/99 |
| 4,528,081 | 7/1985 | Lien et al. | 522/99 |
| 4,585,670 | 4/1986 | Liu | 522/99 |

Primary Examiner—Melvyn I. Marquis
Attorney, Agent, or Firm—Vidas & Arrett

[57] ABSTRACT

A method of curing a liquid silicone composition to a crosslinked polymer on a substrate having shadow areas no readily accessible to direct UV light, the method comprising:
(a) applying a liquid composition to the substrate in a manner so as to cover both the light accessible and the shadow areas, the composition comprising a radical photoinitiator and a crosslinkable polydihydrocarbylsiloxane prepolymer having a molecular weight of at least 1000, having a plurality of acrylate or methacrylate groups bound thereto and further including a plurality of groups of the formula

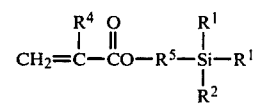

where $R^1$ is a hydrolyzable organic group and $R^2$ is $R^1$ or, if $R^1$ is dialkylamino, $R^2$ is $R^1$ or hydrocarbyl;
(b) irradiation the substrate with UV irradiation sufficient to substantially cure the composition in the areas directly accessible to UV light, and
(c) exposing the composition on the substrate to moisture for sufficient time to cure the composition in the shadow areas. Suitable polydihydrocarbyl siloxanes have the formula:

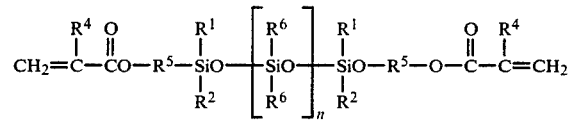

where n is an integer, $R^1$ is selected from amino, oxime or $-OOCR^3$, $R^2$ is $R^1$ or hydrocarbyl, provided that when $R^1$ is not amino, $R^2$ is the same as $R^1$, $R^3$ is hydrocarbyl, $R^4$ is H or methyl, $R^5$ is a organo group having a carbon atom bound to the adjacent silicon atom and $R^6$ is a hydrocarbyl group, said prepolymer having a molecular weight of at least 1,000.

16 Claims, No Drawings

DUAL CURING COATING METHOD FOR SUBSTRATES WITH SHADOW AREAS

This application is a continuation in part of U.S. Ser. No. 538,624, filed Oct. 3, 1983, now U.S. Pat. No. 4,528,081 incorporated herein by reference.

BACKGROUND OF THE INVENTION

Because of their excellent thermal stability, low temperature flexibility and high dielectric strength, silicones have been used for coating, potting or encapsulating electrical devices such as integrated circuits. Potting or encapsulating materials typically used are elastomeric or gel-like materials providing shock, vibrational and thermal stress protection on fragile electronic parts. References relating generally to silicone gel encapsulants include U.S. Pat. Nos. 3,933,712; 4,072,635; 4,087,585; 4,271,425; 4,374,967; and D. Dickson, Jr., proceedings Electric/Electronic Intel. Conf. 12, 92 (1975). See also prior art description in U.S. Pat. No. 4,374,967.

The present commercially available potting silicones include one component compositions such as U.S. Pat. No. 4,271,425 which are cured by moisture, requiring several hours to days to complete the cure. Faster cures may be obtained from two component systems such as those in U.S. Pat. No. 4,087,585 if elevated temperatures are provided. The two component systems which require a platinum catalyst, however, are inhibited by organotin compounds, sulfur, amines, urethanes and unsaturated hydrocarbon plasticizers on the substrate surface. Curable silicone formulations have also been used for providing crosslinked environmentally resistant coatings on articles such as electronic circuit boards and the like which include raised parts such as resistors, transistors, micro chips, etc.

It is known that certain silicones containing methacrylate or acrylate functional groups may be cured by ultraviolet light. U.S. Pat. Nos. 4,201,808 and 4,348,454 and U.K. Patent application No. GB2039287A all describe U.V. curing compositions of silicones containing methacrylates or acrylates for paper release coatings. Such materials, however, have not been used on substrates, such as electronic circuit boards, which include light inaccessible or "shadow" areas because the coating compositions cannot be cured in these areas by ultraviolet light.

SUMMARY OF THE INVENTION

The present invention is directed to a novel method of providing a cured crosslink coating or an encapsulant on a substrate having shadow areas not readily accessible to light. The method of the invention involves the use of silicone polymer compositions capable of both U.V. and moisture curing. In the inventive method such compositions are applied to a substrate having shadow areas; the light accessible areas are irradiated to give a cured overcoat sufficient to allow storage, packaging or further processing of the article; and then the shadow areas are gradually cured by a moisture cure mechanism to give a fully crosslinked environmentally resistant coating over the entire substrate.

DETAILED DESCRIPTION OF THE INVENTION

The inventive relies on a dual curing mechanism. The coating or potting formulation is applied to a substrate having shadow areas in such a manner as to fully coat the exposed surfaces, including the under sides of raised parts such as resistors transistors or micro chips. U.V. irradiation of the coating cures the coating on the light inaccessible areas. Since light inaccessible areas are generally protected from mechanical disruption, the coated parts can be immediately processed in subsequent assembly operations. Thus more efficient automated processes for manufacturing electronic components are facilitated. The coating or encapsulant in light inaccessible areas then gradually cures by exposure to atmosphere of moisture over a period of one or more days. Some further moisture crosslinking of the light cured coating is also likely during this period. The result is a tough environmentally resistant cured coating over the entire exposed surface of the part, without assembly delays inherent in processes utilizing purely moisture cured silicone materials.

Compositions utilized in the inventive method include, as an essential ingredient a linear or branched organosiloxane which includes a plurality of acrylic functional groups bound to silicon atoms thereof and a plurality of siloxane units of the formula:

where $R^1$ is a hydrolyzable organic group, $R^2$ is $R^1$ or, if $R^1$ is dialkyl amino, $R^2$ is $R^1$ or hydrocarbyl. Examples of suitable hydrolyzable organic groups are: alkoxy; aryloxy; oxime (i.e. $-ON=C(R^3)_2$); acid liberating (i.e. $-OOCR^3$); N,N-dialkylamino; N,N-dialkylaminoxy; N-alkylamido; .

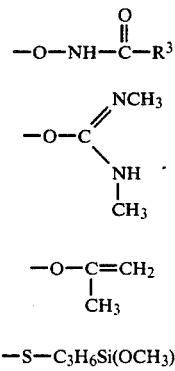

$$-S-C_3H_6Si(OCH_3)_3$$

where $R^3$ is H or hydrocarbyl. Most preferably $R^1$ is methoxy, oxime such as acetoximino (otherwise known as dimethylketoximino) or acetoxy.

Thus, the polyorganosiloxane is a resin which contains both acrylic and hydrolyzable functionality. It is to be understood that the open valency on the silicone atom in the above formula may be linked to other siloxane repeat units, to one of the acrylic functional groups or to an $R^2$ group.

Suitably the resins are polydihydrocarbylsiloxanes, such as polydimethyl, polydiphenyl, or polymethylphenyl siloxanes, terminated with groups of the formula:

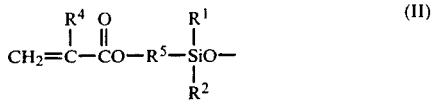

where $R^4$ is H or methyl and $R^5$ is a divalent organic group having a carbon atom bound to the silicon atoms, preferably an alkylene, or alkenylene, group. However, the acrylic and hydrolyzable groups may also be bound to different silicon atoms along the polymer backbone. The polyorganosiloxane polymer may have a molecular weight as low as about 1,000 but preferably the molecular weight will be at least 10,000.

As discussed above, U.V. curing of some organosiloxane compounds of this type in the lower, less preferred molecular weight range, has previously been reported for paper coatings and the like. However, it has heretofore not been contemplated that such materials, suitably formulated, would be useful for curing on substrates having shadow areas inaccessible to direct U.V. light. In formulating useful dual curing compositions of the invention it is generally advisable to include in the formulation a moisture curing catalyst, such as an orthotitanate catalyst, in the formulation. Where the hydrolyzable groups are methoxy or other hydrocarbonoxy groups, such catalysts are generally necessary to achieve shadow cure. On the other hand, where the hydrolyzable groups are amino, such catalysts are typically not necessary.

The dual curing compositions utilized in the inventive method also include a photosensitizer. Any known radical photosensitizer can be used as well as mixtures thereof without departing from the invention hereof. Simple photoinitiators include benzoin and substituted benzoin compounds, benzophenone, Michler's ketone, dialkoxybenzophenones, dialkoxyacetophenones, etc. Photosensitizers made compatible with silicones by binding photoinitiating groups to organosiloxane polymer backbones, such as the compounds disclosed in U.S. Pat. Nos. 4,477,326, 4,507,187 and in copending application Nos. 528,287 of Aug. 31, 1983, now U.S. Pat. No. 4,587,276, and 655,398 of Sept. 27, 1984, now U.S. Pat. No. 4,534,838 incorporated herein by reference, may also be used.

The amount of photosensitizer used in the compositions will typically be in the range of between about 0.1% and 5% of the composition. Depending on the characteristics of the particular photosensitizer, however, amounts outside of this range may be employed without departing from the invention so long as they perform the function of rapidly and efficiently intitiating polymerization of the acrylic groups. In particular, higher percentages may be required if silicone bound photosensitizers are used with high equivalent weight per photoinitiating group.

It should also be understood that while the photosensitizer is listed as a separate ingredient, the formulations used in the inventive method are intended to include formulations in which photoinitiating groups are included on the backbone of the same polyorganosiloxane polymer which includes the acrylic groups and hydrolyzable groups discussed above.

The inventive compositions may also contain other additives so long as they do not interfere with the U.V. and moisture curing mechanisms. These include adhesion promoters such as 2,3-epoxypropyltrimethoxsilane, methacryloxypropyltrimethoxysilane, triallyl-S-triazine-2,4,6(1H,3H,5H,)-trione and others known to those skilled in the art; fillers such as silica, microballoon, glass, etc. Further examples of fillers usable to modify the inventive compositions may be found in U.S. Pat. No. 4,072,635 at column 4, line 40—column 5, column line 7.

In electronic coating or potting applications, ion trapping compounds such as crown ethers and cryptates may be useful for reducing ionic conductivity. Examples are 18-crown-6, 12-crown-4 and 15-crown-4 and 15-crown-5. See also U.S. Pat. No. 4,271,425 where the use of crown ethers in conventional RTV silicone encapsulants are described.

Reactive silicones usable in the inventive method are readily prepared from silanol terminated silicones:

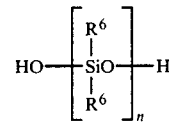

of appropriate molecular weight, where $R^6$ are the same or different organo groups, preferably selected from methyl and phenyl groups. Preferably the silanol terminated silicone is a polydimethylsiloxane having a viscosity of at least about 600 cps. Silanol terminated dimethylsiloxanes having a viscosities up to at least about 50,000 cps may be useful. Most preferably between about 750 and 25,000 cps.

The silanol terminated silicones are condensed with excess silane of the formula:

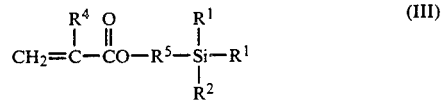

where $R^1$, $R^2$, $R^4$ and $R^5$ are previously defined. While a variety of condensation procedures may be used, it is much prefered that the reaction be run at 60°–100° C. in the presence of a condensation catalyst such as an orthotitanate or tertiary amine and that substantially all the alcohol produced by the reaction by removed by vacuum. The products of this process give superior storage stable dual curing formulations compared to silicones produced by other prior art processes such as disclosed in U.S. Pat. No. 4,290,869 or No. UK1323869.

Generally, silanes satisfying formula III may be obtained commercially or may be synthesized by techniques well known in the art. In the case where $R^1$ is $-S-C_3H_6-Si(OCH_3)_3$, the silane may be obtained from the reaction of methacryloxypropyltrichlorosilane and mercaptopropyltrimethoxysilane in the presence of a base such as pyridine.

The invention may be further understood with reference to the following non-limiting examples.

EXAMPLE 1

In a round-bottomed flask 50.0 g of a hydroxyl terminated polydimethylsiloxane of 680 cst viscosity (0.3% hydroxyl by weight), 2.62 g methacryloxypropyltrimethoxysilane and 0.21 g tetraisopropylorthotitanate were reacted on a rotary evaporator at 10 mm Hg pressure and 80° C. for two hours. The viscosity of the mixture increased for the first hour and then decreased during the second hour. A full vacuum (approximately 0.5 mm Hg) was applied for an additional 4 hours at 80° C. The flask was removed from the evaporator and flushed with nitrogen. The reactive silicone product was a yellow liquid.

The product was then used to formulate soft gel potting compounds by mixing with 100 cst or 1,000 cst trimethylsilyl terminated silicone oils. The mixtures ranged from 0–90% silicone oil. To each of these mixtures was added 2% by weight diethoxyacetophenone as photoinitiator. Samples of these compositions, about $\frac{1}{4}''$ thick, were then cured by 1–2 minute exposure to UV irradiation of about 70,000 microwatts/cm$^2$ or by 24 hour moisture cure at ambient temperature and humdity. Above about 70% oil content, curing was very difficult and nonflowable products were not achieved by the moisture cure mechanism. Samples containing between 0 and 70% oil ranged, respectively, from a soft rubbery material (Shore A 10–15) to a very soft sticky gel (Shore A unmeasurable) which showed some tendency to creep but would not flow.

EXAMPLE 2

The synthetic procedure of Example 1 was repeated using 50.0 g of a 3500 cst hydroxyl terminated polydimethylsiloxane (28,000 MW), 1.05 g methacryloxypropyl trimethoxysilane and 0.20 g tetraisopropylorthotitanate. The product was a viscous liquid. A sample of the product was mixed with 2% diethoxyacetophenone and cured with UV irradiation of 70,000 microwatts/cm$^2$ to a stretchable soft rubber. Another sample of the same composition cured to a slightly softer rubber after $2\frac{1}{2}$ days exposure to ambient temperature and humidity.

EXAMPLE 3

A methacryloxypropyldimethoxysilyl terminated polydimethylsiloxane was prepared from 101.7 g of a 20,000 cst silanol terminated dimethylsiloxane, 2.6 g methacryloxypropyltrimethoxysilane and 0.3 g tetraisopropylorthotitanate in a manner similar to that of Examples 1 and 2 except that 100.9 g of a 100 cst trimethylsilyl terminated silicone oil was added to the mixture prior to heating. The resulting product had a viscosity of 21,200 cps.

3.05 g of the 21,200 cps product were then mixed with 0.6 g of the same 100 cst silicone oil and 0.07 g dimethoxyacetophenone. This composition, containing 58% oil, cured to a soft gel 1/16" deep upon exposure to UV of about 70,000 microwatts/cm$^2$ for 60 seconds.

193.8 g of the 21,200 cps product were mixed with 45 g of the 100 cst silicone oil and 5 g diethoxyacetophenone. The mixture was cast into $\frac{1}{8}''$ thick open top molds and cured by UV light of the same intensity for six intervals of 20 seconds each, with a cooling period between each interval. The samples were then allowed to moisture cure overnight after which they were removed from the molds in 4"×4" square pieces, turned over, and the bottom surfaces subjected to three 20 second intervals of UV exposure to reduce tackiness. 4"×4" pieces were then subjected to electrical testing, the results of which are given in Table I below:

TABLE I

| Test Performed | Individual Values | Average Value |
| --- | --- | --- |
| ASTM D-149, Dielectric Strength, volts/mil | 340 230 210 250 260 | 260 |
| ASTM D-256, Volume Resistivity, 10$^{14}$ ohm-cm· | 3.8 3.9 4.8 3.5 3.5 | 3.9 |

TABLE I-continued

| Test Performed | Individual Values | | Average Value |
| --- | --- | --- | --- |
| ASTM D-150, Dielectric Constant, 10$^2$ Hz | 2.87 | 4.28 | 3.58 |
| ASTM D-150, Dielectric Constant, 10$^5$ Hz | 2.59 | 2.83 | 2.71 |
| ASTM D-150, Dissipation Factor, 10$^2$ Hz | 0.0018 | 0.0017 | 0.0018 |
| ASTM D-150, Dissipation Factor, 10$^5$ Hz | 0.0012 | 0.0012 | 0.0012 |

EXAMPLE 4

Rhone-Poulenc silanol-terminated silicone 48V3500 (50.0 g, 3.53×10$^{-3}$ eq silanol) was mixed with 1.46 g (4.41×10$^{-3}$ mole) of methacryloxypropyltriacetoxysilane and placed in a rotary evaporator, turning and heating for 3 hours at 80° C. and 0.2 mm. At this point, the vacuum was broken with dry nitrogen and five grams removed and mixed with 0.1 g diethoxyacetophenone (Sample A). Another five grams was removed and mixed with 0.03 g dibutyltindilaurate and allowed to stand in air (Sample B). Curing was as follows:

A. Cured by 70 mw/cm$^2$ UV radiation, 1 min/side, 3/16" thick.
B. Left to stand in air overnight.

Both cured to approximately the same consistency, namely, a fully cured rubber with low to moderate elongation.

EXAMPLE 5

Rhone-Poulenc silanol-terminated silicone 48V3500 (25.0 g, 1.765×10$^{-3}$ eq silanol) was mixed with 0.82 g (2.21×10$^{-3}$ mole) of methacryloxypropyltris(acetoximo)silane and placed in a rotary evaporator, turning and heating for 3 hours at 80° C. and 0.2 mm. At this point, the vacuum was broken with dry nitrogen. Dibutyltin dilaurate (0.02 g) and 0.4 g diethoxyacetophenone were added to the remaining material and were dissolved into the resin under N$_2$. Samples of this formulation ($\frac{1}{8}''$ deep in a beaker) were cured by exposure to ambient moisture overnight and by irradiation with UV light, 70 mw/cm$^2$, for 1 min. per side. Both samples gave fully cured rubbers with moderate to long elongation.

The above formulation is useful for glass bonding even without added adhesion promotor. Thus, when pressed between two glass microscope slides, overlapping 1" at rt angles, and irradiated with 70 mw/cm$^2$ UV for 1 min., the slides could not be pulled apart. When the bonded slides were flexed perpendicularly to give a test of peel strength, the slides broke leaving the bond intact. Good bonding of glass slides was also obtained by overnight exposure to ambient temperature.

Coatings made by applying two drops of the above formulation on to microscope slides and curing by either UV or overnight ambient were found to be resistant to finger peel.

EXAMPLE 6

A 28,000 mw alpha, omega-dihydroxy-polydimethylsiloxane (viscosity=3500 cps), was heated for several hours at 70°–80° C. with a slight excess of methacryloxypropyltrimethoxysilane in the presence of triethylamine to give a methacryloxypropyldimethoxysilyl terminated polymer. Methanol and triethylamine were then vacuum stripped at 80° C. to give a product designated 28K MA-dMeO.

A circuit board containing raised resistors, diodes and transistors was dipped into a formulation as follows:

| 28K-MA-dMeO | 100 parts |
|---|---|
| HDK-2000* silica | 25 parts |
| methyltrimethoxysilane | 4 parts |
| tetrabutoxyorthotitanate | 1 part |
| diethoxyacetophenone | 2 parts |
| trichloroethane | 198 parts |

*available from Wacker-Chemie G.m.b.H.

The trichloroethane solvent was allowed to evaporate and the board dipped a second time. After evaporation of solvent, a thick coating of uncured silicone remained on the parts, including the undersides of the components.

The board was then irradiated in UV light of 70 mw/cm$^2$ for 1 min/side. The coating had cured to a tack free solid on the tops of the components and on the parts of the board not shadowed by the components. Therefore, the board could be easily handled. However, the coatings were uncured on the undersides of the components and the areas shadowed thereby. In these shadow areas, the uncured coating stuck to a probe needle. The sides of the board and some of the larger components were cured but still slightly tacky.

Within a few hours the sides of the board and the components were tack free. Overnight the coating cured to a tough rubbery coating in the shadow areas as well as over the rest of the board.

We claim:

1. A method of curing a liquid silicone composition to a crosslinked polymer on a substrate having shadow areas not readily accessible to direct UV light, the method comprising:

(a) applying a liquid composition to the substrate in a manner so as to cover both the light accessible and the shadow areas, the composition comprising a radical photoinitiator and a crosslinkable polydihydrocarbylsiloxane prepolymer having a molecular weight of at least 1000, having a plurality of acrylate or methacrylate groups bound thereto and further including a plurality of groups of the formula

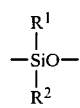

where R$^1$ is a hydrolyzable organic group and R$^2$ is R$^1$ or, if R$^1$ is dialkylamino, R$^2$ is R$^1$ or hydrocarbyl;

(b) irradiating the substrate with UV irradiation sufficient to substantially cure the composition in the areas directly accessible to UV light, and (c) exposing the composition on the substrate to moisture for sufficient time to cure the composition in the shadow areas.

2. The method of claim 1 wherein R$^1$ is selected from the group consisting of alkoxy, aryloxy, oxime, OOCR$^3$, N,N-dialkylamino, N,N-dialkylaminoxy, N-alkylamido,

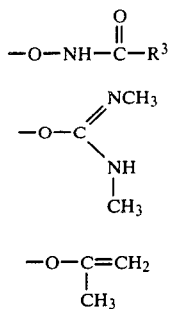

and

—S—C$_3$H$_6$Si(OCH$_3$)$_3$ where R$^3$ is H or hydrocarbyl.

3. The method of claim 1 wherein the composition further comprises a moisture curing catalyst.

4. The method of claim 1 wherein R$^1$ is selected from the group consisting of alkoxy, oxime and OOCR$^3$ where R$^3$ is H or hydrocarbyl.

5. The method of claim 4 wherein R$^1$ is selected from the group consisting of methoxy, acetoximino, and acetoxy, and the composition further comprises a moisture curing catalyst.

6. The method of claim 3 wherein the moisture curing catalyst is an orthotitanate catalyst.

7. The method of claim 1 wherein said polyorganosiloxane prepolymer has the formula

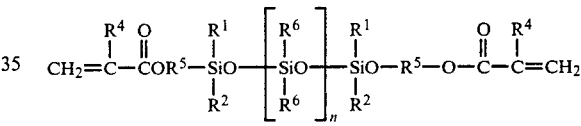

where n is an integer; R$^1$ and R$^2$ are as defined in claim 1; R$^4$ is H or methyl; R$^5$ is a divalent organic group having a carbon atom bound to the atom adjacent silicon atom and R$^6$ is a hydrocarbyl group.

8. The method of claim 7 wherein R$^5$ is selected from the group consisting of alkylene and alkenylene and the R$^6$ groups are selected from the group consisting of methyl, phenyl and mixtures thereof.

9. The method of claim 7 where the polyorganosiloxane prepolymer has a molecular weight of at least 10,000.

10. The method of claim 6 where R$^1$ is amino and the composition is free of moisture curing catalyst.

11. The method of claim 1 wherein said substrate comprises an electronic circuit board having raised components.

12. A polyorganosiloxane prepolymer crosslinkable by moisture of free radical curing mechanisms having the formula:

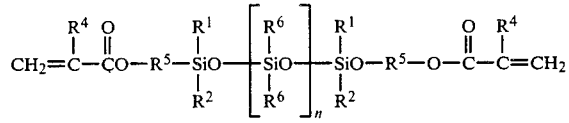

where n is an integer, R$^1$ is selected from amino, oxime or —OOCR$^3$, R$^2$ is R$^1$ or hydrocarbyl, provided that when R$^1$ is not amino, R$^2$ is the same as R$^1$, R$^3$ is hydrocarbyl, $R^4$ is H or methyl, $R^5$ is a organo group having a carbon atom bound to the adjacent silicon atom and $R^6$ is a hydrocarbyl group, said propolymer having a molecular weight of at least 1,000.

13. A prepolymer as in claim 12 prepared by condensation of a silane of the formula

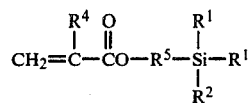

with a polydihydrocarbylsiloxane having terminal condensable groups and a viscosity between 600 and 50,000 cps.

14. A prepolymer as in claim 13 wherein said polydihydrocarbylsiloxane with terminal condensable groups is a silanol terminated polydimethylsiloxane having a viscosity between about 750 and 25,000 cps.

15. A prepolymer as in claim 12 which is liquid at ambient temperature.

16. The method of claim 1 wherein the moisture curing step comprises exposing the composition on the substrate to ambient atmospheric moisture.

* * * * *